United States Patent [19]

Saho et al.

[11] Patent Number: 4,986,077

[45] Date of Patent: Jan. 22, 1991

[54] CRYOSTAT WITH CRYO-COOLER

[75] Inventors: Norihide Saho, Tsuchiura; Takeo Nemoto, Ibaraki; Yoshihide Shizuoka, Hitachi, all of Japan

[73] Assignee: Hitachi, Ltd., Tokyo, Japan

[21] Appl. No.: 540,790

[22] Filed: Jun. 20, 1990

[51] Int. Cl.$^5$ ............................................. F25B 19/00
[52] U.S. Cl. ...................................... 62/51.1; 250/352
[58] Field of Search ................. 62/51.1, 51.2; 250/352

[56] References Cited

U.S. PATENT DOCUMENTS

| | | | |
|---|---|---|---|
| 4,432,216 | 2/1984 | Matsuda et al. | 62/51.1 |
| 4,502,296 | 3/1985 | Ogata et al. | 62/51.1 |
| 4,510,771 | 4/1985 | Matsuda et al. | 62/51.1 |
| 4,796,433 | 1/1989 | Bartlett | 62/51.1 |
| 4,840,043 | 6/1989 | Sakitani et al. | 62/51.2 |
| 4,841,268 | 6/1989 | Burnett et al. | 62/51.1 |
| 4,878,352 | 11/1989 | Weber et al. | 62/51.1 |

FOREIGN PATENT DOCUMENTS 63-51849  3/1988  Japan .

Primary Examiner—Ronald C. Capossela
Attorney, Agent, or Firm—Antonelli, Terry, Stout & Kraus

[57] ABSTRACT

A cryostat comprises a vacuum vessel, a partition wall for air-tightly separating the vacuum vessel into a first vacuum chamber and a second vacuum chamber, thermal shield tubes encapsulated within the first vacuum chamber, a cooler encapsulated within the thermal shield for containing therein a body to be cooled and cryogen for cooling the body to be cooled, a cryo-cooler disposed outside of the vacuum vessel, which has a cooling portion disposed within the second vacuum chamber, a heat transfer passage along which heat is transferred from the thermal shield tubes to the cooling portion of the cryo-cooler through a part of the partition wall, at least two openings provided in the second vacuum chamber, through which the second vacuum chamber is capable of being opened to atmosphere, and covers each detachably mounted to the respective openings for maintaining the second vacuum chamber at a vacuum condition, on which covers the cryo-cooler is mounted.

11 Claims, 6 Drawing Sheets

CRYOSTAT WITH CRYO-COOLER

FIELD OF THE INVENTION AND RELATED ART STATEMENT

This invention relates to a cryostat with a cryo-cooler. This type of cryostat with a cryo-cooler cools, for example, a superconducting magnet of a nuclear magnetic resonance device.

A conventional cryostat with a cryo-cooler, for example, as disclosed in JP-A-63-51849 includes a vacuum vessel containing liquid helium as a cryogen for cooling a superconducting magnet. Liquid helium is very expensive, and can easily evaporate, and therefore is contained in a thermal shield tube. A helium cryo-cooler is disposed outside of the vacuum vessel, and a cooling portion of this cryo-cooler is joined to a heat transfer plate of the thermal shield tube so as to cool the liquid helium. Those joint portions of the cooling portion and the heat transfer plate, as well as the thermal shield tube, are disposed within a common vacuum chamber of the vacuum vessel.

When it is required to exchange the helium cryo-cooler, the vacuum chamber must be opened to the atmosphere in order to separate the cooling portion of the helium cryo-cooler from the heat transfer plate. For this reason, before exchanging the helium cryo-cooler, the electric current in the superconducting magnet must be once taken out to the exterior, and the overall temperature of the cryostat must be increased by evaporating all of the liquid helium. Then, after exchanging the helium cryo-cooler, the vacuum chamber must be again brought into a vacuum condition, and liquid helium must be again filled in the vacuum vessel and be again cooled. Further, the superconducting magnet must be energized again.

Thus, the conventional cryostat with a cryo-cooler suffers from the problems that each time the helium cryo-cooler is exchanged, a large amount of cryogen is lost, and that a longer time is required for starting the operation of the cryostat.

OBJECT AND SUMMARY OF THE INVENTION

It is therefore an object of this invention to provide a cryostat which suppresses a loss of cryogen at the time of exchanging a cryo-cooler, and can start its operation within a short time.

In order to achieve this object, according to the present invention, there is provided a cryostat comprising:
a vacuum vessel;
partition means for air-tightly separating the vacuum vessel into a first vacuum chamber and a second vacuum chamber;
thermal shield means encapsulated within the first vacuum chamber;
a cooler encapsulated within the thermal shield means for containing therein a body to be cooled and cryogen for cooling the body to be cooled;
a cryo-cooler disposed outside of the vacuum vessel, the cryo-cooler having a cooling portion which portion is disposed within the second vacuum chamber;
a heat transfer passage along which heat is transferred from the thermal shield means to the cooling portion of the cryo-cooler through a part of the partition means;
at least two openings provided in the second vacuum chamber, through which the second vacuum chamber is capable of being opened to atmosphere; and
cover means detachably mounted to the respective openings for maintaining the second vacuum chamber at a vacuum condition, on which cover means the cryo-cooler is mounted.

Other objects and features of the invention will become manifest from following description of preferred embodiments of the invention upon making reference to the accompanying drawings.

DETAILED DESCRIPTION OF PREFERRED EMBODIMENTS

Figure 1:
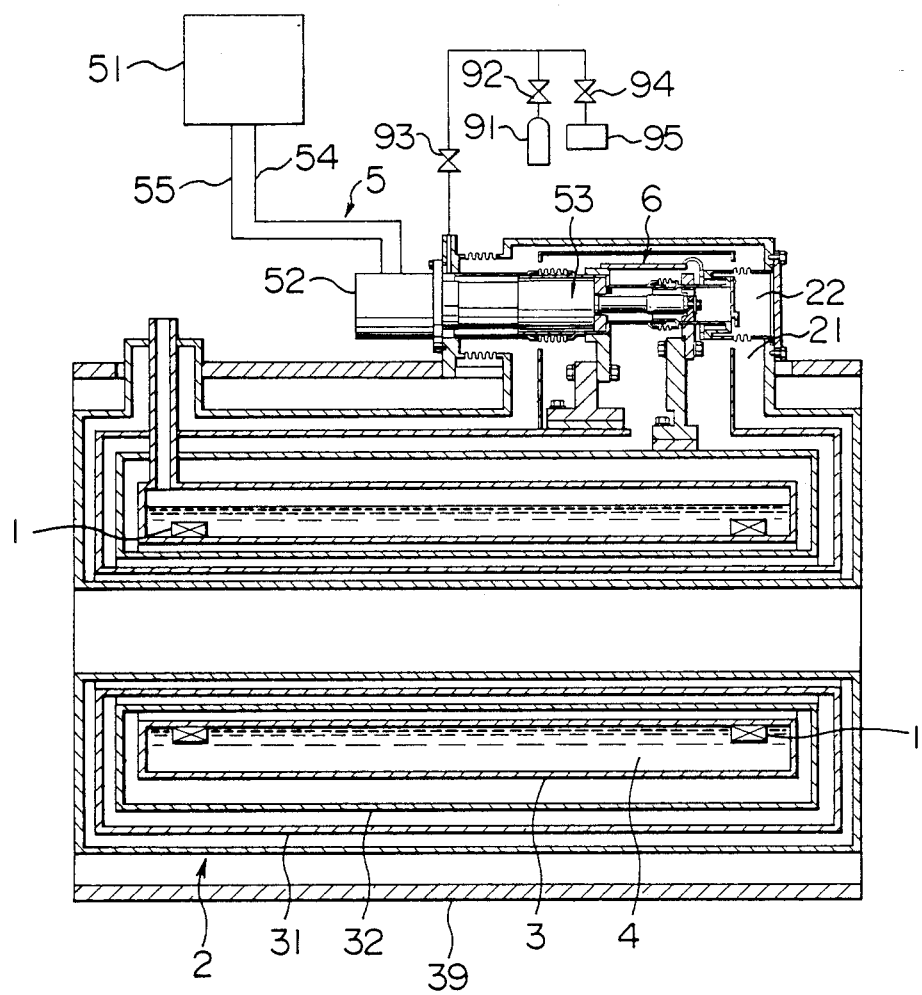
FIG. 1 is a cross-sectional view of a first preferred embodiment of a cryostat of the invention used in a nuclear magnetic resonance device.
Figure 2:
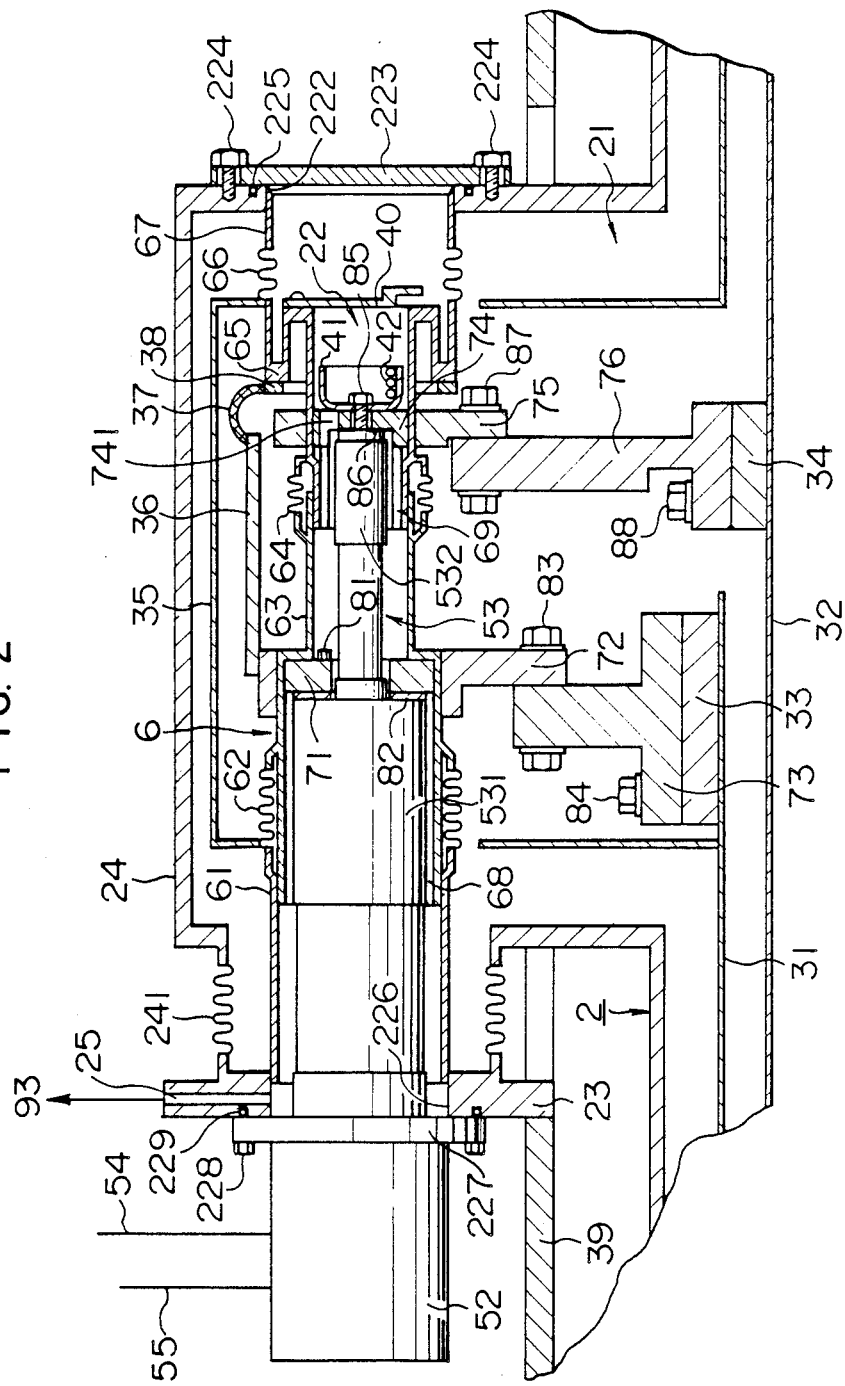
FIG. 2 is an enlarged fragmental cross-sectional view of the cryostat of FIG. 1.

A cryostat shown in FIGS. 1 and 2 is used for cooling superconducting magnets 1 of a nuclear magnetic resonance device. The cryostat comprises a vacuum vessel 2 of stainless steel containing a helium container 3. The helium container 3 contains the superconducting magnets 1 and liquid helium 4 for keeping the magnets 1 in a super-conducting condition. The cryostat further comprises a helium cryo-cooler 5 which includes a compressor 51, a body 52 and a cooling portion 53. The vacuum vessel 2 is divided by a partition wall 6 into a first vacuum chamber 21 and a second vacuum chamber 22. The helium container 3 is surrounded by an outer thermal shield tube 31 and an inner thermal shield tube 32. The cooling portion 53 of the helium cryo-cooler 5 cools the thermal shield tubes 31 and 32 to keep the liquid helium at extremely low temperatures, thereby maintaining the superconducting magnets 1 in a super-conducting condition. The helium container 3 as well as the thermal shield tubes 31 and 32 are disposed within the first vacuum chamber 21, and the cooling portion 53 of the cryo-cooler 5 is disposed within the second vacuum chamber 22.

The Partition wall 6 comprises a shell 61 of stainless steel, a bellows 62 of stainless steel, a shell 63 of stainless steel, a bellows 64 of stainless steel, a stainless steel shell 65 of a multi-wall construction, a bellows 66 of stainless steel, and a shell 67 of stainless steel, which are joined together (FIG. 2).

The second vacuum chamber 22 has at one end thereof an opening 222 open to the atmosphere. A cover 223 is removably attached to the opening 222 by bolts 224. The opening 222 is air tightly closed by the cover 223 and an O-ring 225. The cover 223 is a part of the wall 24 of the vacuum vessel 2 after it is mounted to the opening 222.

A flange 23 is formed on the other end of the second vacuum chamber 22, which is provided with an opening 226 open to the atmosphere. A cover 227 of stainless steel is removably attached to the opening 226 by bolts 228. The opening 226 is air-tightly closed by the cover 227 and an O-ring 229. The flange 23 is secured to a magnetic shield member 39 greater in mass than the vacuum vessel 2 of the cryostat. A portion of the wall 24 of the vacuum vessel 2 disposed adjacent to the flange 23 is constituted by a bellows 241. With this arrangement, the cryo-cooler body 52 can be easily mounted in place, and vibrations of the cryo-cooler can be absorbed, thereby suppressing the generation of noises.

The cooling portion 53 of the helium cryo-cooler 5 has a first cold station 531 and a second cold station 532. These cold stations 531 and 532 extends through the cover 227 and the opening 226 into the second vacuum chamber 22. The body 52 of the helium cryo-cooler 5 is mounted onto the cover 227.

The first cold station 531 and the outer thermal shield tube 31 are thermally interconnected by a first heat transfer means. The second cold station 532 and the inner thermal shield tube 32 are thermally interconnected by a second heat transfer means.

The first heat transfer means comprises an inner heat transfer flange 71 of copper or alumina which is joined at one side thereof to the first cold station 531 by a bolt 81 through an intervening ring 82 of indium and is joined at an outer periphery thereof to the inner periphery of the shell 63, an outer heat transfer flange 72 of copper or alumina thermally connected or joined to the inner heat transfer flange 71 through the shell 63, a heat transfer plate 73 of copper joined to the outer heat transfer flange 72 by a bolt 83, and a seat 33 joined to the heat transfer plate 73 by a bolt 84 and also joined to the outer thermal shield tube 31.

The second heat transfer means, like the first heat transfer means, comprises an inner heat transfer flange 74 of copper or alumina which is joined at one side thereof to the second cold station 532 by a bolt 85 through an intervening ring 86 of indium and is joined at an outer periphery thereof to the inner periphery of the shell 65, an outer heat transfer flange 75 of copper or alumina thermally connected to the inner heat transfer flange 74 through the shell 65, a heat transfer plate 76 of copper joined to the outer heat transfer flange 75 by a bolt 87, and a seat 34 joined to the heat transfer plate 76 by a bolt 88 and also joined to the inner thermal shield tube 32. A cooling panel 41 is secured to the inner heat transfer flange 74 by the bolt 85.

The shell 63 is metallurgically joined integrally to the inner heat transfer flange 71 and the outer heat transfer flange 72 by soldering or brazing, and similarly the shell 65 is metallurgically joined integrally to the inner heat transfer flange 74 and the outer heat transfer flange 75 by soldering or brazing.

To prevent the intrusion of radiant heat from an ordinary temperature portion, a thermal shield tubular half 35 covers the cold stations 531 and 532. A heat transfer plate 36 is thermally connected at one end thereof to the outer heat transfer flange 72, and at the other end thereof to a thermal shield 38 through a heat transfer member 37 in the form of a copper net. Therefore, a thermal shield disk 40 is secured to an inner Portion of the shell 65 by screws, thereby preventing the intrusion of radiant heat from the ordinary temperature portion.

Sleeves 68 and 69 are disposed within the shells 63 and 65 spaced from the respective inner peripheries of the shells to provide an annular clearance therebetween with this construction, even when the cryo-cooler body 52 is not mounted, the shells 63 and 65 are held in coaxial relation to each other.

Next, the procedure of exchanging the cryo-cooler 5 will now be described.

First, the operation of the cryo-cooler 5 is stopped. Then, helium gas is supplied from a gas bomb 91 to the second vacuum chamber 22 through valves 92 and 93 and a gas inlet port 25 formed in the flange 23, until the pressure of the second vacuum chamber 22 reaches a level substantially equal to the atmospheric pressure. While supplying the helium gas from the gas bomb 91, the cover 223 is detached. Thereafter, the opening 222 is closed by a vinyl sheet or the like, and in this condition the thermal shield disk 40 and the cooling panel 41 are detached. Then, a tool is inserted into a notch 741 formed in the inner heat transfer flange 74 so as to remove the bolt 81. Finally, the bolts 228 are removed, and the body 52 and the cooling portion 53 of the cryo-cooler 5 are removed by detaching the cover 227 from the vacuum vessel 2.

When a new cryo-cooler 5 is to be attached, the cooling portion 53 of the new cryo-cooler 5 is inserted into the second vacuum chamber 22 and the cover 227 is fastened to the flange 23 by bolting, and the inner heat transfer flange 71 is fastened to the first cold station 531 by bolting. Then, the thermal shield disk 40 and the cooling panel 41 are connected to the second cold station 532 by bolting. Finally, the cover 223 is fastened by bolting. Then, the valve 92 is closed, and a valve 94 is opened, and the second vacuum chamber 22 is evacuated to vacuum by a vacuum pump 95. The residual helium gas is condensed and absorbed by the cooling panel 41 and an absorbent, such as activated charcoal 42 provided on the cooling panel 41, thereby increasing the degree of vacuum within the vacuum vessel 2. Then, the cryo-cooler 5 is operated. Helium gas of high pressure is supplied from the compressor 51 to an expander of the body 52 through a pipe 55, and is subjected to adiabatic expansion to produce cold. The expanded helium gas is returned to the compressor 51 through a pipe 54. Therefore, the first cold station 531 and the second cold station 532 are cooled to about 80K and about 20K, respectively. Further, the outer and the inner thermal shield tubes 31 and 32 within the first vacuum chamber 21 are cooled respectively by the first and the second cold stations 531 and 532 through the first and the second heat transfer means. Soon, the cryostat is returned to its predetermined operating condition.

In this embodiment, when the cryo-cooler 5 is to be exchanged, the first vacuum chamber 21 containing the outer thermal shield tube 31 and the inner thermal shield tube 32 is not opened to the atmosphere, but is maintained in a vacuum condition. Therefore, the thermal insulation of the helium container 3 is not affected, and the loss of the helium gas due to evaporation can be suppressed.

Further, when the cryo-cooler is to be exchanged, all that must be done is to release and fasten the bolts, and to supply the gas into the second vacuum chamber and to discharge the gas therefrom. Therefore, the exchange can be done readily, and the cryostat can be returned to its predetermined operating condition in a short time.

Further, because the partition wall 6 has the bellows 62, 64 and 66, the thermal strinkage of the cooling portion of the cryo-cooler as well as vibrations of the cryo-cooler is absorbed. This prevents a fatigue failure of the wall of the second vacuum chamber 22. Further, the heat transfer passage between the covers 223 and 227 as well as the heat transfer passage between each cover and each heat transfer flange can be made longer, and then the heat transfer is rendered less, thereby reducing the intrusion of the heat into each cold station.

Since the opposite ends of the second vacuum chamber 22 can be opened to the atmosphere, the partition wall 6 is affected by neither a compressive load nor a tensile load due to pressurizing to the atmospheric pressure and evacuating to vacuum on exchanging of the cryo-cooler. Therefore, the thickness of the bellows 62, 64 and 66 of the partition wall 6 can be made small. With this arrangement, the heat transfer by conduction can be kept to a small level, and the amount of intruding heat directed toward the thermal shield tubes can be reduced.

Further, in this embodiment, the cover 227, the partition wall 6 and the vacuum vessel 2 are all made of stainless steel, and are joined to one another by welding, thereby enhancing the air-tightness between the first vacuum chamber 21 and the second vacuum chamber 22.

As the helium cryo-cooled, a Gifford-McMahon cryo-cooler, a Solvey cryo-cooler, a Stirling cryo-cooler, a Clude cryo-cooler, a Vuilleumier cryo-cooler and a Pulse Tube cryo-cooler can be used. Also, instead of the helium cryo-cooler, an electronic cryo-cooler with a Peltier device which does not use helium gas can be used.

Figure 3:
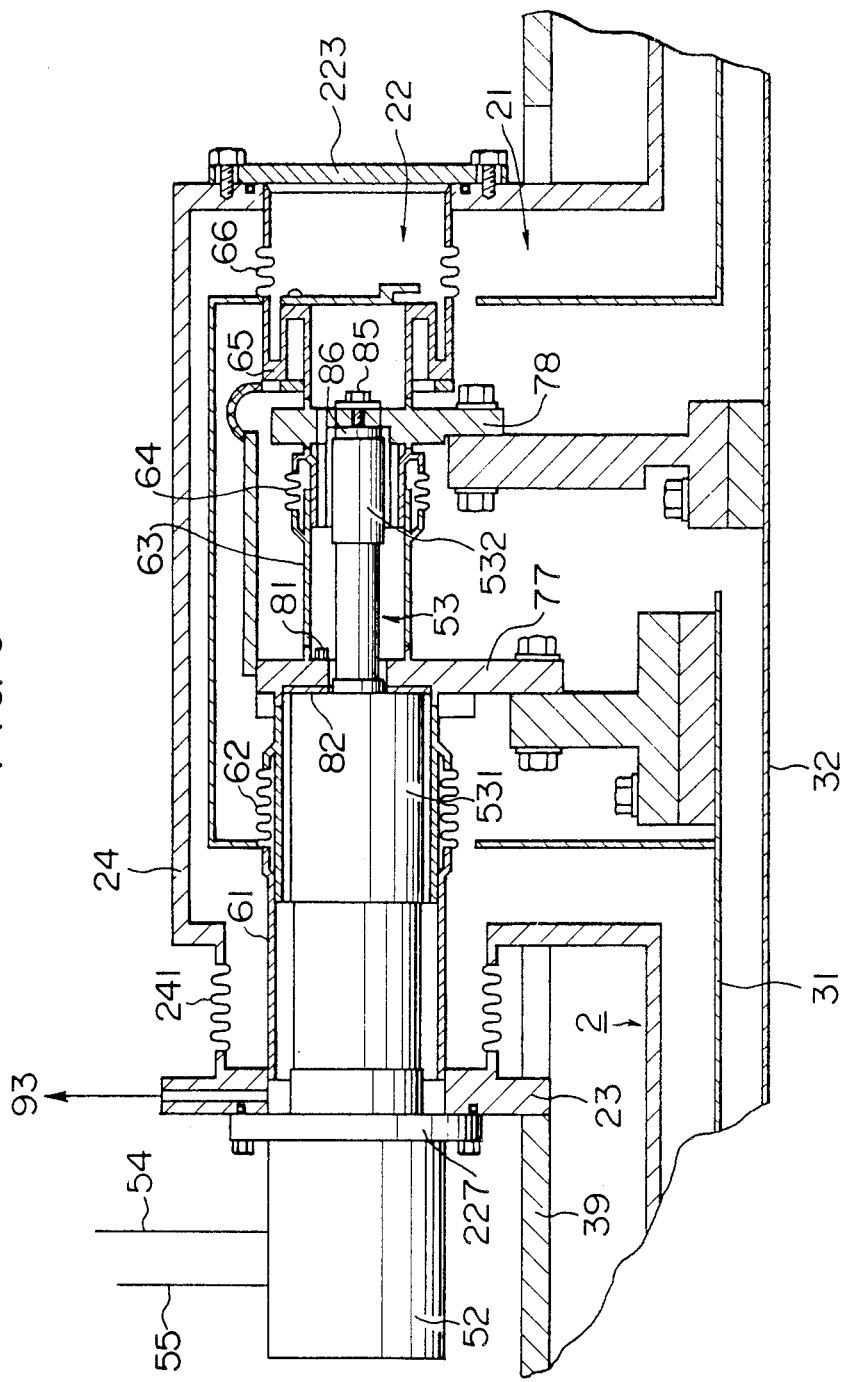
FIGS. 3 to 5 are fragmental cross-sectional views showing modified forms of the cryostat of FIG. 1, respectively.

A modified cryostat shown in FIG. 3 differs from the cryostat of FIG. 1 in that the inner and the outer heat transfer flanges 71 and 72 is replaced by a single heat transfer flange 77 of copper or aluminum and that the inner and outer heat transfer flanges 74 and 75 are replaced by a single heat transfer flange 78 of copper or aluminum. The heat transfer flanges 77 and 78 are connected respectively to the first and the second cold stations 531 and 532 by a bolt 81 and a bolt 85, respectively. The bonding between the heat transfer flange 77 of copper or aluminum and the shell 63 of stainless steel (that is, the bonding between different metals), as well as the bonding between the heat transfer flange 78 of copper or aluminum and the shell 65 of stainless steel (that is, the bonding between different metals), is effected by brazing, a diffusion bonding, a friction bonding, or an explosion bonding. Since each of the heat transfer flanges 77 and 78 is of a one-piece construction, the resistance to heat transfer in the heat transfer flange is small, and therefore the thermal shield tubes can be further cooled, thereby further reducing the amount of evaporation of the helium gas.

Figure 4:
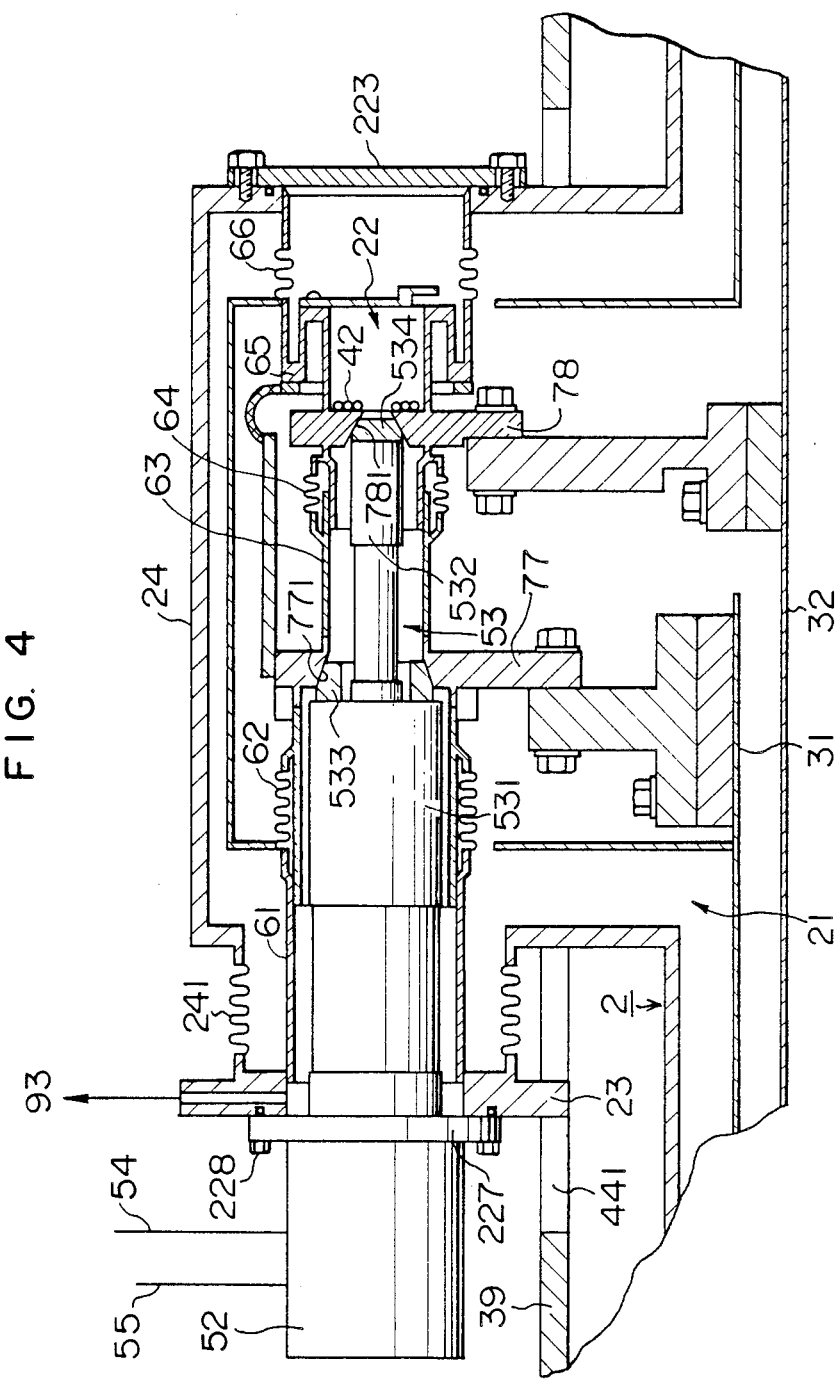

Another modified cryostat shown in FIG. 4 differs from the cryostat of FIG. 3 in that the connection of each heat transfer flange to a respective one of the cold stations is made not by the bolt, but by frictional contact between tapered portions More specifically, a truncated cone-shaped ring 533 is thermally integrated with the first cold station 531 by brazing, and a truncated cone-shaped ring 534 is thermally integrated with the second cold station 532 by brazing. Heat transfer flanges 77 and 78 respectively have recesses 771 and 781 which are complementary in shape to the truncated cone-shaped rings 533 and 534, respectively. The magnetic shield member 39 has a notch 441 for allowing the movement of the flange 23. With this construction, by fastening the cover 227 to the flange 23 by the bolts 228, each of the heat transfer flanges can be thermally integrated with a respective one of the cold stations. In this embodiment, the use of the cooling panel is omitted, and activated charcoal 42 is bonded directly to the heat transfer flange 78.

In this embodiment, due to a pressure differential between the second vacuum chamber 22 and the atmosphere, each of the cold stations is positively pressed against a respective one of the heat transfer flanges. If the pressure of the second vacuum chamber 22 is increased to a level substantially equal to the atmospheric pressure when the cryo-cooler is to be exchanged, the cooling portion of the cryo-cooler can be easily taken out merely by releasing the bolt 228.

Further, the cover 223 may be joined directly to the vacuum vessel 2 by welding. Also, the cover 227 may be mounted on the magnetic shield member 39 so as to move in the direction of insertion of the cooling portion of the cryo-cooler, in which case the weights of the cover 227 and the cryo-cooler body 52 are supported by the magnetic shield member 39.

Figure 5:
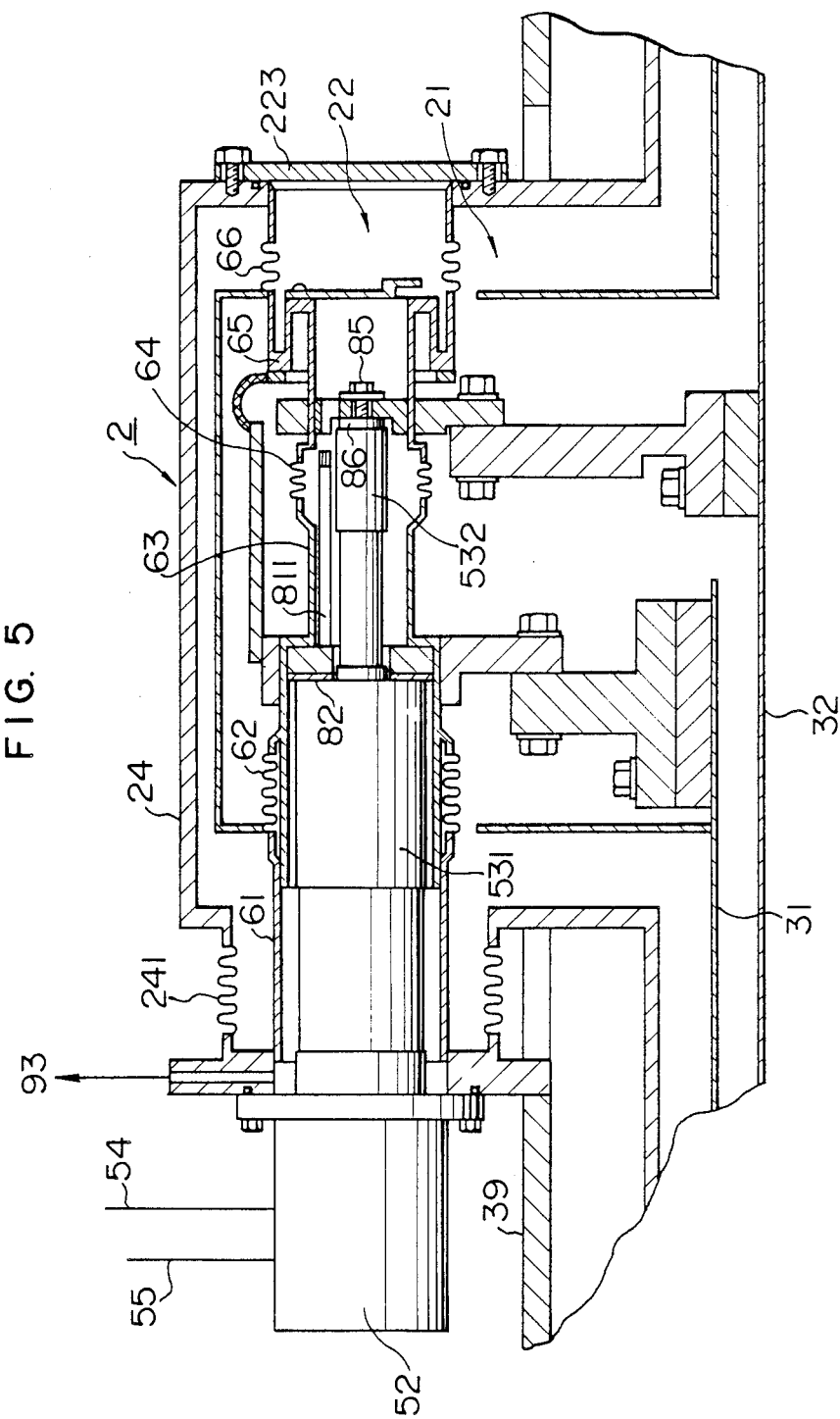

A further modified cryostat shown in FIG. 5 differs from the cryostat of FIG. 1 in that instead of the bolt 81, a long bolt 811 is used for joining the inner heat transfer flange 71 to the first cold station 531. With this construction, since the bolt 811 and the bolt 85 are disposed adjacent to each other, the fastening and releasing of the bolt can be facilitated.

Figure 6:
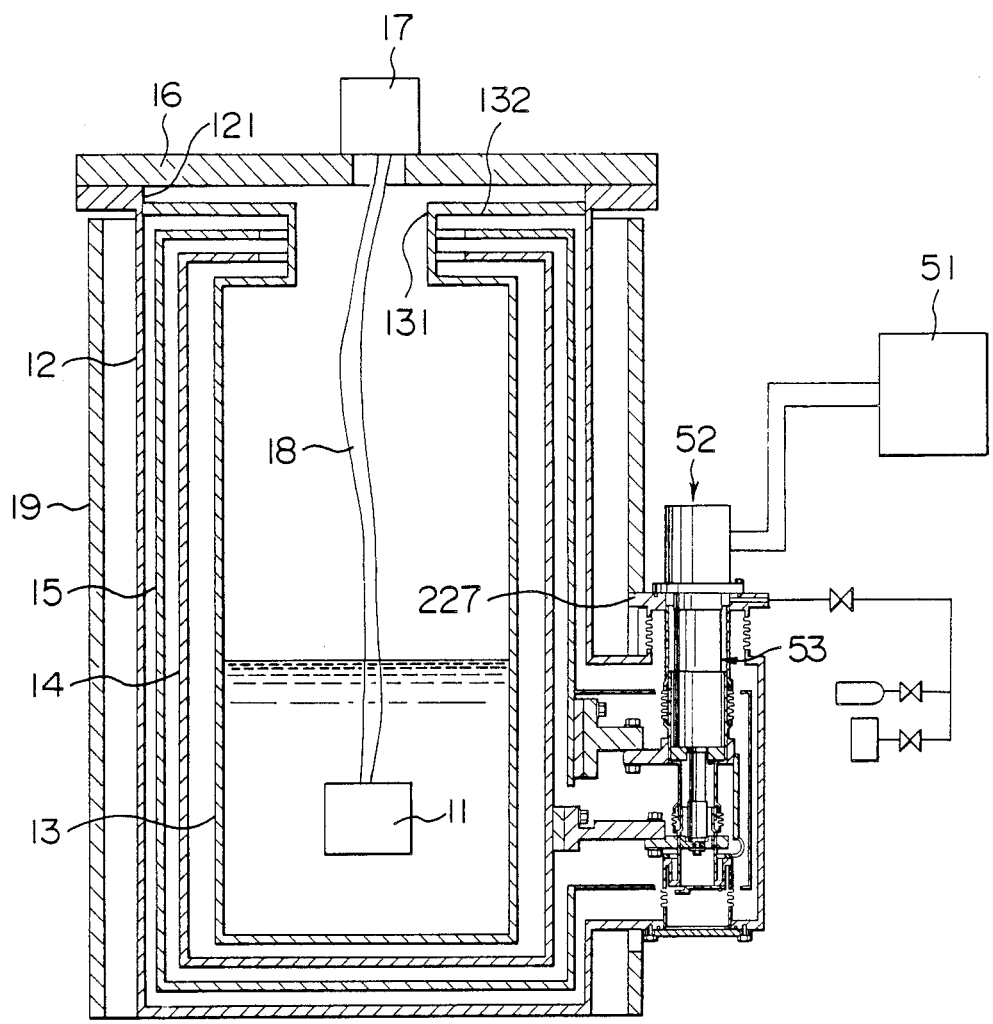
FIG. 6 is a cross-sectional view of a second preferred embodiment of a cryostat of the invention used for cooling a cryoelectronics device.

FIG. 6 shows cryostat according to another embodiment of the invention designed to cool an electric device 11 such as a sensor using a Josephson device or a superconducting quantum interference device. Except for the shapes of a helium container, a thermal shield and a vacuum vessel, the cryostat of FIG. 6 is of the same construction as that of the cryostat of FIG. 1, and therefore description of the remainder will be omitted here. The helium container 13 has a tubular shape, and has an opening 131 at its top. A flange 132 of the helium container 13 is joined to an opening 121 of the vacuum vessel 12. An inner thermal shield tube 14 and an outer thermal shield tube 15 are mounted around the helium container 13. The opening 121 is closed by a cover 16. A connector 17 is mounted on the cover 16, and is connected to the electric device 11 through lead wires 18. A non-magnetic shield tube 19 made, for example, of permalloy or stainless steel is mounted around the vacuum vessel 12. The cover 227 of the vacuum vessel 12 is fixedly mounted on the non-magnetic shield tube 19. The cryostat of this embodiment achieves the same effects as the cryostat of FIG. 1.

What is claimed is:
1. A cryostat comprising:
a vacuum vessel;
partition means for air-tightly separating said vacuum vessel into a first vacuum chamber and a second vacuum chamber;
thermal shield means encapsulated within said first vacuum chamber;
a cooler encapsulated within said thermal shield means for containing therein a body to be cooled and cryogen for cooling said body to be cooled;
a cryo-cooler disposed outside of said vacuum vessel, said cryo-cooler having a cooling portion which portion is disposed within said second vacuum chamber;
a heat transfer passage along which heat is transferred from said thermal shield means to said cooling portion of said cryo-cooler through a part of said partition means;
at least two openings provided in said second vacuum chamber, through which said second vacuum chamber is capable of being opened to atmosphere; and
cover means detachably mounted to said respective openings for maintaining said second vacuum chamber at a vacuum condition, on which cover means said cryo-cooler is mounted.

2. A cryostat according to claim 1, wherein said partition means extend through said heat transfer passage and wherein said partition means and said heat transfer passage are thermally integrated with each other.

3. A cryostat according to claim 2, wherein said partition means partially include bellows portion.

4. A cryostat according to claim 2, wherein further comprises gas adsorPtion means thermally integrated into said cooling portion of said cryo-cooler.

5. A cryostat according to claim 1, wherein said heat transfer passage includes a heat transfer member which is joined to said cooling portion and extends through said partition means to said thermal shield means.

6. A cryostat according to claim 5, wherein said heat transfer member is joined to said cooling portion by a bolt.

7. A cryostat according to claim 5, wherein one of said heat transfer member and said cooling portion has a wedge-shaped surface, whereas the other has a surface complementary to said wedge-shaped surface, and said heat transfer member and said cooling portion are joined together through a frictional contact between said two surfaces.

8. A cryostat according to claim 1, wherein said heat transfer passage includes a first heat transfer member which is joined to said cooling portion and is abutted against said partition means, and a second heat transfer member which is abutted against said partition means and extends to said thermal shield means, said first and said second heat transfer members being thermally integrated with each other through said partition means.

9. A cryostat according to claim 8, wherein said first heat transfer member is joined to said cooling portion by a bolt.

10. A cryostat according to claim 8, wherein one of said heat transfer member and said cooling portion has a wedge-shaped surface, whereas the other has a surface complementary to said wedge-shaped surface, and said heat transfer member and said cooling portion are joined together through a frictional contact between said two surfaces.

11. A cryostat comprising:
a vacuum vessel having a wall;
Partition means having a wall for air-tightly separating said vacuum vessel into a first vacuum chamber and a second vacuum chamber, said partition means include a wall portion of said vacuum vessel which faces to atmosphere as a wall portion of said partition means;
thermal shield means encapsulated within said first vacuum chamber;
a cooler encapsulated within said thermal shield means for containing therein a body to be cooled and cryogen for cooling said body to be cooled;
a cryo cooler disposed outside of said vacuum vessel, said cryo-cooler having a cooling portion which portion is disposed within said second vacuum chamber;
a heat transfer passage along which heat is transferred from said thermal shield means to said cooling portion of said cryo-cooler through a part of said partition means;
at least one opening provided in said second vacuum chamber, through which said second vacuum chamber is capable of being opened to atmosphere; and
cover means detachably mounted to said respective openings for maintaining said second vacuum chamber at a vacuum condition, on which cover means said cryo-cooler is mounted.

* * * * *

UNITED STATES PATENT AND TRADEMARK OFFICE
CERTIFICATE OF CORRECTION

PATENT NO. : 4,986,077
DATED     : January 22, 1991
INVENTOR(S) : Saho, et al

It is certified that error appears in the above-identified patent and that said Letters Patent is hereby corrected as shown below:

On the title page, insert the following:

--[30]  Foreign Application PRiority Data

Jun. 21, 1989  [JP]   Japan......................1-156776--.

Signed and Sealed this

Seventeenth Day of November, 1992

*Attest:*

DOUGLAS B. COMER

*Attesting Officer*    *Acting Commissioner of Patents and Trademarks*